(12) United States Patent
Lim et al.

(10) Patent No.: US 7,974,103 B2
(45) Date of Patent: Jul. 5, 2011

(54) LCD SIGNAL TRANSFER MEMBERS

(75) Inventors: Myong-Bin Lim, Seoul (KR); Jae-Han Lee, Chungcheongnam-do (KR); Sun-Kyu Son, Suwon-si (KR); In-Yong Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 570 days.

(21) Appl. No.: 11/893,043

(22) Filed: Aug. 13, 2007

(65) Prior Publication Data

US 2008/0062666 A1 Mar. 13, 2008

(30) Foreign Application Priority Data

Sep. 13, 2006 (KR) .................. 10-2006-0088713

(51) Int. Cl.
*H05K 7/00* (2006.01)
(52) U.S. Cl. ........ 361/777; 361/760; 257/200; 257/288; 257/371; 333/128; 345/80; 345/87; 345/100; 345/211; 349/149
(58) Field of Classification Search .................. 361/777, 361/760; 345/100, 89, 80, 211, 87; 257/200, 257/371, 288; 333/128; 349/149
See application file for complete search history.

(56) References Cited

U.S. PATENT DOCUMENTS

| | | | | |
|---|---|---|---|---|
| 6,037,654 A * | 3/2000 | Tamura | ........................ | 257/668 |
| 6,054,975 A * | 4/2000 | Kurokawa et al. | ............ | 345/100 |
| 6,128,063 A * | 10/2000 | Uchiyama et al. | ............ | 349/150 |
| 6,172,661 B1 * | 1/2001 | Imajo et al. | ..................... | 345/89 |
| 6,483,492 B1 * | 11/2002 | Takeuchi et al. | ................ | 345/63 |
| 6,529,180 B1 * | 3/2003 | Ito et al. | ........................... | 345/89 |
| 6,529,181 B2 * | 3/2003 | Nakano et al. | .................. | 345/98 |
| 6,765,561 B1 * | 7/2004 | Stoller | ........................... | 345/205 |
| 7,023,058 B2 * | 4/2006 | Kanno et al. | .................. | 257/371 |
| 7,106,292 B2 * | 9/2006 | Moon | ........................... | 345/100 |
| 7,129,998 B2 * | 10/2006 | Ohgiichi et al. | ................ | 349/40 |
| 7,231,711 B2 * | 6/2007 | Hwang et al. | .................. | 29/825 |
| 7,259,738 B2 * | 8/2007 | Zhang et al. | .................... | 345/87 |
| 7,342,634 B2 * | 3/2008 | Park | .............................. | 349/151 |
| 7,375,718 B2 * | 5/2008 | Kim | .............................. | 345/100 |
| 7,466,302 B2 * | 12/2008 | Kim et al. | ..................... | 345/102 |
| 7,473,996 B2 * | 1/2009 | Son et al. | ........................ | 257/735 |
| 7,492,340 B2 * | 2/2009 | Isami et al. | ..................... | 345/89 |
| 2002/0011606 A1 * | 1/2002 | Otake et al. | .................. | 257/200 |
| 2002/0167026 A1 * | 11/2002 | Azami et al. | .................. | 257/200 |

(Continued)

OTHER PUBLICATIONS

Search report of P 17825EP dated Jun. 25, 2009.

*Primary Examiner* — Xiaoliang Chen
(74) *Attorney, Agent, or Firm* — Innovation Counsel LLP

(57) ABSTRACT

A signal transfer member for a liquid crystal display (LCD) apparatus includes a power line for receiving power from an external source and for driving a semiconductor chip disposed on the transfer member or the display apparatus. The power line is bent so as to incorporate a serpentine structure, which enables the length of the power line to be easily adjusted and results in the line being longer than a power line formed with a relatively straight structure. Accordingly, the length of the power line can be adjusted to take into account the respective impedances of the chip and the external source so as to suppress electromagnetic waves in the power line. This prevents the creation of noise, distortion of signals, damage to the semiconductor chip, and disconnection of the input interconnection thereof that are caused by the electromagnetic waves, so that product yields are thereby improved.

17 Claims, 5 Drawing Sheets

U.S. PATENT DOCUMENTS

| | | |
|---|---|---|
| 2003/0086048 A1 | 5/2003 | Ukita |
| 2003/0103027 A1* | 6/2003 | Kim et al. .................. 345/87 |
| 2003/0234760 A1 | 12/2003 | Lin et al. |
| 2004/0189554 A1* | 9/2004 | Russ et al. .................. 345/80 |
| 2004/0212578 A1 | 10/2004 | Itou et al. |
| 2005/0018121 A1 | 1/2005 | Jen et al. |
| 2005/0088391 A1* | 4/2005 | Kim ............................. 345/94 |
| 2005/0219230 A1* | 10/2005 | Nakayama et al. .......... 345/173 |
| 2005/0219236 A1* | 10/2005 | Sano et al. .................. 345/211 |
| 2006/0044828 A1* | 3/2006 | Kim et al. .................... 362/613 |
| 2006/0125743 A1* | 6/2006 | Lee et al. ..................... 345/80 |
| 2007/0012774 A1* | 1/2007 | Cho et al. .................... 235/435 |

* cited by examiner

LCD SIGNAL TRANSFER MEMBERS

RELATED APPLICATIONS

This application claims priority of Korean Patent Application No. 2006-88713, filed Sep. 13, 2006, the entire disclosure of which is incorporated herein by reference.

BACKGROUND

This invention relates to signal transfer members for liquid crystal displays (LCDs) that improve product yields.

LCDs display images by using a liquid crystal material that has unique electrical and optical characteristics, such as dielectric anisotropy and refractive index anisotropy. LCDs typically include a liquid crystal display panel, which displays images, and a backlight assembly, which provides light to the liquid crystal display panel.

A typical liquid crystal display panel includes an array substrate, a color filter substrate facing the array substrate, and a layer of the liquid crystal material interposed between the array substrate and the color filter substrate. The array substrate includes a plurality of data lines that transmit respective image data signals, a plurality of gate lines that transmit respective gate signals, and a plurality of pixels, which are the basic elements used to form an image. Each pixel includes a thin film transistor and a pixel electrode. The thin film transistor is connected to an associated data line and an associated gate line and is operable to switch a pixel voltage that is applied to the liquid crystal layer therein. The pixel electrode is electrically connected to a drain electrode of the thin film transistor. The pixel electrode is disposed in opposition to a common electrode formed on the color filter substrate, with the liquid crystal layer interposed therebetween.

The data lines are electrically connected to a plurality of data tape carrier packages ("TCPs"), and the gate lines are electrically connected to a plurality of gate TCPs. The data TCPs and the gate TCPs are bonded to the array substrate so as to respectively output data signals and gate signals thereto.

The structure of the TCPs is generally as follows. Each TCP includes a base film, a driving chip mounted on the base film, input lines, which are provided on the base film to provide input signals received from an external source to the driving chip, and output lines that are provided on the base film to transmit output signals of the driving chip to the array substrate. The interconnections of the TCP are formed so as to minimize the distance from input pads of the input lines and the driving chip without taking into account any impedance matching between an associated printed circuit board and the driving chip, or any impedance matching between the driving chip and the array substrate. Accordingly, undesirable electromagnetic radiation may be are generated from the input lines, thereby potentially causing distortion of the input signals, damage to the driving chip, and/or disconnection of the input lines.

BRIEF SUMMARY

In accordance with the exemplary embodiments described herein, LCD signal transfer members are provided that overcome the above problems and thereby improve product yields.

In one exemplary embodiment, a signal transfer member includes a base film, a semiconductor chip, an input interconnection, and an output interconnection. The semiconductor chip is mounted on the base film and operable to receive a first signal and to output a second signal in response thereto. The input interconnection is formed on the base film and electrically connected to the semiconductor chip so as to receive the first signal from an external source and to provide the first signal to the semiconductor chip, a portion of the input interconnection being bent so as to incorporate a serpentine structure. The output interconnection is formed on the base film and electrically connected to the semiconductor chip so as to receive the second signal from the semiconductor chip and transmit the second signal to an external destination.

The first signal includes a chip power signal, which drives the semiconductor chip, and a chip control signal, which causes the chip to generate the second signal.

More specifically, the input interconnection includes a plurality of input power lines that transmit the power signal to the chip, and at least one of which is bent to incorporate a serpentine structure, and a plurality of input signal lines that transmit the control signal to the chip. In this embodiment, the input power line incorporating the serpentine structure is bent in a widthwise direction of the input power line.

The input interconnection further comprises a plurality of dummy power lines that receive power signals from an external source and output the power signals to an external destination without passing to or from the semiconductor chip. At least one of the dummy power lines is bent to incorporate a serpentine structure.

In another exemplary embodiment, a display apparatus includes a display panel and at least one signal transfer member for transferring signals to the panel. The display panel displays an image corresponding to an image signal. The signal transfer member is bonded to an end portion of the display panel to output the image signal and provide it to the display panel. In detail, the signal transfer member includes a base film, a semiconductor chip, an input interconnection, and an output interconnection. The semiconductor chip is mounted on the base film and is operable to receive an input signal corresponding to the image from an external source and to output the image signal in response thereto. The input interconnection is formed on the base film and electrically connected to the semiconductor chip to provide the input signal to the chip, and at least a portion of the input interconnection is bent so as to incorporate a serpentine structure. The output interconnection is formed on the base film and electrically connected to the semiconductor chip and the display panel to provide the image signal output from the semiconductor chip to the display panel.

In another exemplary embodiment, a display apparatus includes a display panel, at least one data tape carrier package, and at least one gate tape carrier package. The display panel displays an image. The data tape carrier package includes a first base film, a first semiconductor chip, a first input interconnection, and a first output interconnection. The first base film is bonded to the display panel. The first semiconductor chip is mounted on the base film and receives a first input signal corresponding to the image from an external source and outputs a data signal. The first input interconnection is formed on the first base film and electrically connected to the first semiconductor chip to provide the first input signal thereto. A portion of the first input interconnection is bent so as to incorporate a serpentine structure. The first output interconnection is formed on the first base film and electrically connected to both the first semiconductor chip and the display panel to provide the data signal output from the first semiconductor chip to the display panel.

The gate tape carrier package includes a second base film, a second semiconductor chip, a second input interconnection, and a second output interconnection. The second base film is bonded to the display panel. The second semiconductor chip is mounted on the second base film, and receives a second input signal corresponding to the image from an external source and outputs a gate signal. The second input interconnection is formed on the second base film and electrically connected to the second semiconductor chip to provide the second input signal thereto. A portion of the second input interconnection is bent so as to incorporate a serpentine structure. The second output interconnection is formed on the second base film and electrically connected to both the second semiconductor chip and the display panel to provide the gate signal output from the second semiconductor chip to the display panel.

In the novel signal transfer members and LCDs incorporating the same, power lines receiving power incorporate a serpentine structure. As a result, the exemplary signal transfer members prevent the creation of noise, distortion of signals, damage to the semiconductor chip and disconnection of the input interconnection caused by electromagnetic waves, so that product yields are thereby improved.

A better understanding of the above and many other features and advantages of the LCD signal transfer members of the present invention may be obtained from a consideration of the detailed description below of some exemplary embodiments thereof, particularly if such consideration is made in conjunction with the appended drawings, wherein like reference numerals are used to identify like elements illustrated in one or more of the figures thereof.

DETAILED DESCRIPTION

Figure 1:
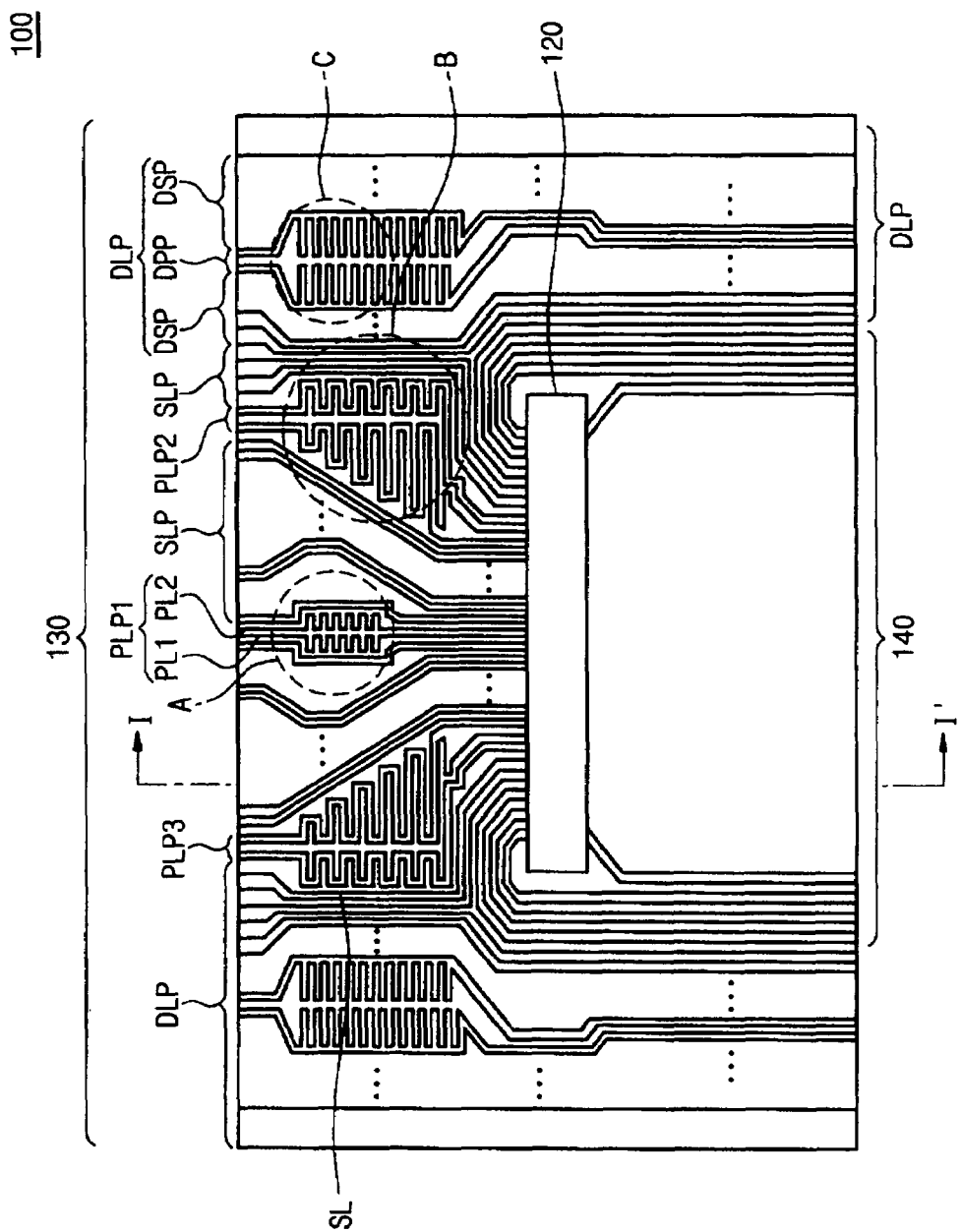
FIG. 1 is a top plan view of an exemplary embodiment of a tape carrier package (TCP) in accordance with the present invention.
Figure 2:
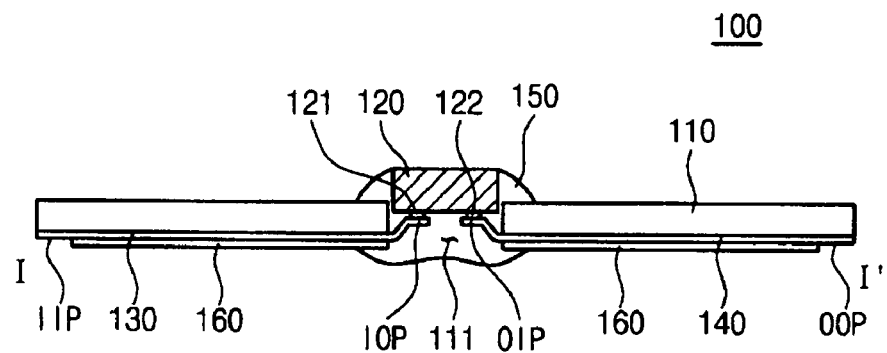
FIG. 2 is a partial cross-sectional view of the exemplary TCP of FIG. 1, as seen along the lines of the section I-I' taken therein.

FIG. 1 is a top plan view of an exemplary embodiment of a tape carrier package (TCP) 100 in accordance with the present invention, and FIG. 2 is a partial cross-sectional view of the exemplary TCP of FIG. 1, as seen along the lines of the section I-I' taken therein.

As illustrated in FIGS. 1 and 2, the exemplary TCP 100 includes a base film 110, a semiconductor chip 120, a conductive input interconnection pattern 130, and a conductive output interconnection pattern 140.

The base film 110 comprises an insulating material, such as polyimide. The semiconductor chip 120 is mounted on the base film 110, and includes transistors that use a first signal input from an external source and output a second signal in response thereto. The first signal drives the semiconductor chip 120, and includes an input power signal that provides the power required to drive the semiconductor chip 120, and a chip control signal that controls the operation of the semiconductor chip 120. The second signal output from the semiconductor chip 120 drives an external destination device connected to the output interconnection 140. In addition, the second signal may also include predetermined data signals.

As illustrated in FIG. 2, the bottom surface of the semiconductor chip 120 is provided with a plurality of input bumps 121 and a plurality of output bumps 122. The input bumps 121 are electrically connected to the input interconnection 130, and the output bumps 122 are electrically connected to the output interconnection 140.

In the particular exemplary embodiment of FIGS. 1 and 2, the input interconnection 130 is formed on the bottom surface of the base film 110, and is electrically connected to an external input device (not illustrated) so as to receive the first signal therefrom.

More specifically, the input interconnection 130 includes power interconnections PLP1 and PLP2 that transmit the input power signal, and an input signal interconnection SLP that transmits the chip control signal. Each of the power interconnections PLP1 and PLP2 includes a plurality of power lines, and the input signal interconnection SLP includes a plurality of input signal lines. Each of the power lines and input signal lines have respective first end portions, each of which is formed with a first input pad IIP that receives the first signal from the external input source, and respective second end portions disposed opposite to the first end portions, each of which is formed with a second output pad IOP that outputs the first signal to the chip 120. Each of the first input pads IIP is formed at a first end portion of the base film 110, and is electrically connected to the external input device, and each of the first output pads IOP is electrically connected to a respective one or more of the input bumps 121 of the semiconductor chip 120.

Figure 3:
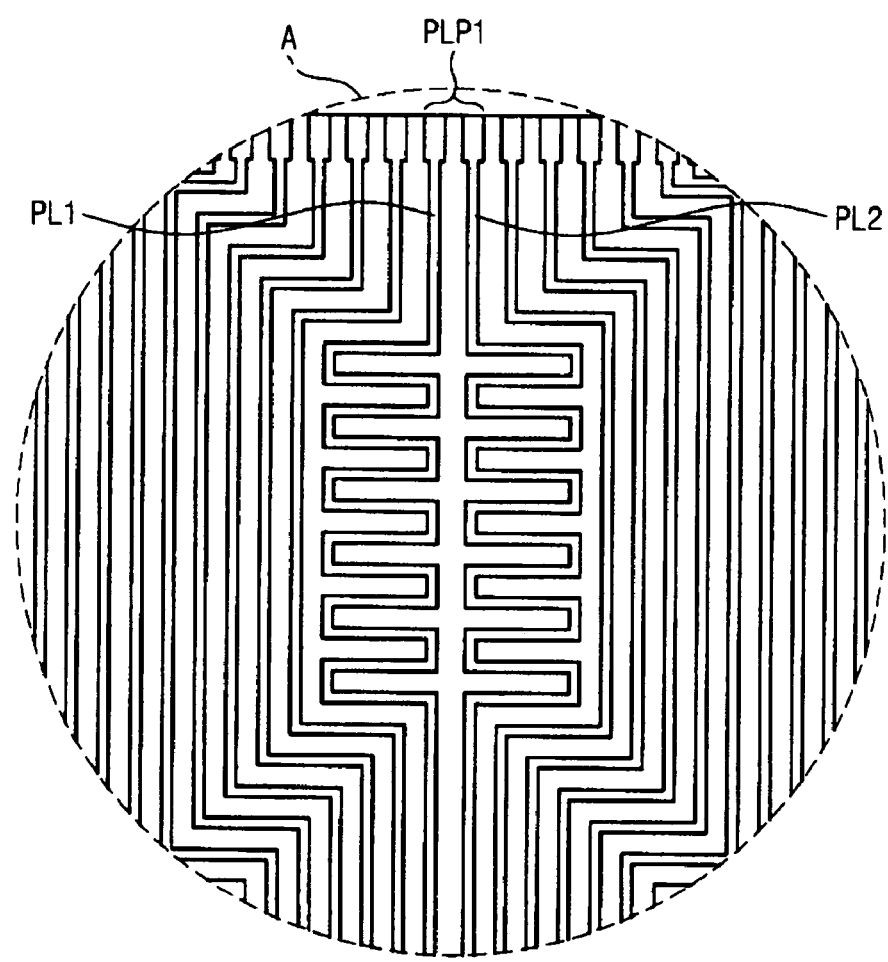
FIG. 3 is an enlarged detail plan view of the region 'A' of the exemplary TCP of FIG. 1.
Figure 4:
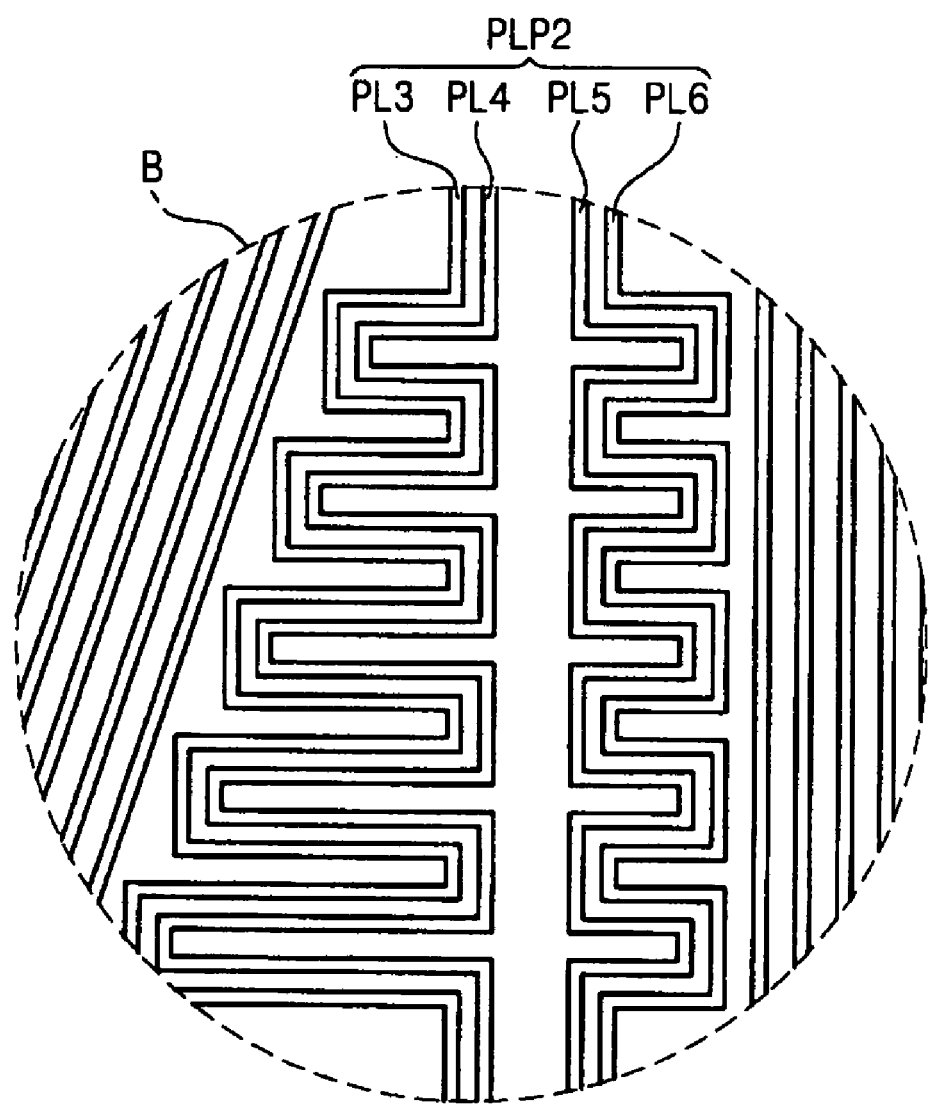
FIG. 4 is an enlarged detail plan view of the region 'B' thereof.

FIG. 3 is an enlarged detail plan view of the region 'A' of the exemplary TCP of FIG. 1, and FIG. 4 is an enlarged detail plan view of the region 'B' thereof. Referring to FIGS. 1 and 3, the power interconnections PLP1 and PLP2 are positioned adjacent to the input signal interconnection SLP. Accordingly, for convenience of explanation, the power interconnection, which is formed at the center of the TCP and crosses the base film 110 in a length direction of the power lines, is referred to herein as a first power connection PLP1. In addition, the power interconnections that are positioned on opposite sides of the first power interconnection PLP1 are referred to herein as second and third power interconnections PLP2 and PLP3, respectively. The input signal lines are interspersed between the first power interconnection PLP1 and the second and third power interconnections PLP2 and PLP3.

As illustrated in FIGS. 1 and 3, the first power interconnection PLP1 includes first and second power lines PL1 and PL2. The first and second power lines PL1 and PL2 are disposed adjacent to and spaced apart from each other by a predetermined distance. The first and second power lines PL1 and PL2 are bent, i.e., include alternating bends that extend in a widthwise direction of the power lines, so as to form a "serpentine" configuration or structure. In one possible embodiment (not illustrated), the first and second power lines PL1 and PL2 can include respective bends that extend in the same direction as each other, or as illustrated in FIG. 3, respective bends that extend in opposite directions from each other.

As described above, since the first and second power lines PL1 and PL2 each forms a serpentine structure, the first and second power lines PL1 and PL2 have respective lengths that are greater, and which can be more easily adjusted, than power lines that are relatively straight, i.e., which do not incorporate such a serpentine structure. Accordingly, the serpentine structures of the first and second power lines PL1 and PL2 enable the input impedance of the semiconductor chip 110 to more exactly match the output impedance of the external input device.

In other words, when impedance matching is performed among the first and second power lines PL1 and PL2, the external input device, and the semiconductor chip 110, the resistance values of the first and second power lines PL1 and PL2 can be made to vary in accordance with the respective lengths thereof. Accordingly, the respective lengths of the first and second power lines PL1 and PL2 can be adjusted by taking into account the respective resistance values of the external input device and the semiconductor chip 110. By doing so, the impedance matching among the first and second power lines PL1 and PL2, the external input device, and the semiconductor chip 110 can be optimized.

As described above, if good impedance matching is achieved among the first and second power lines PL1 and PL2, the external input device, and the semiconductor chip 110, then electromagnetic waves from the first and second power lines PL1 and PL2 are suppressed. This, in turn, prevents the occurrence of noise in the input power signal, any disconnection of the first and second power lines PL1 and PL2, and any damage to the semiconductor chip 110.

Referring to FIGS. 1 and 4, the second power interconnection PLP2 and the third power interconnection PLP3 have the same structures, but are disposed symmetrically with respect to each other about a longitudinal line passing through about the middle of the semiconductor chip 120. Accordingly, the structure of the second power interconnection PLP2 on the right side of the line is described in detail below by way of example.

Referring to FIG. 4, the second power interconnection PLP2 includes third, fourth, fifth, and sixth power lines PL3, PL4, PL5, and PL6. In addition, the third, fourth, fifth, and sixth power lines PL3, PL4, PL5, and PL6 are arranged sequentially, and each is partially bent in a widthwise direction so as to incorporate a serpentine structure, as described above.

As above, the third and fourth power lines PL3 and PL4 can incorporate respective bends that extend in the same direction as each other, as illustrated in FIG. 4, or in another possible embodiment (not illustrated), that extend in opposite directions from each other. Additionally, as illustrated in FIG. 4, the lengths of the longitudinally extending portions of the third and fourth power lines PL3 and PL4 may be the same as or may differ from the lengths of the laterally extending portions thereof.

The fifth and sixth power lines PL5 and PL6 can also have respective bends that extend in the same or in opposite directions, as above, and further, can be bent in the same or in opposite directions relative to the third and fourth power lines PL3 and PL4. Also, as described above, the lengths of the longitudinally extending portions of the fifth and sixth power lines PL5 and PL6 may be the same as or may differ from the lengths of the laterally extending portions thereof.

As discussed above, since each of the third, fourth, fifth, and sixth power lines PL3, PL4, PL5, and PL6 incorporates a serpentine structure, their respective lengths are both greater, and can be more easily adjusted, than lines that do incorporate such serpentine structures. Accordingly, when impedance matching is implemented among the third, fourth, fifth, and sixth power lines PL3, PL4, PL5, and PL6, the external input device, and the semiconductor chip 110, the lengths of the third, fourth, fifth, and sixth power lines PL3, PL4, PL5, and PL6 can be adjusted by taking into account the resistance values of the external input device and the semiconductor chip 110.

Thus, the impedance matching among the third, fourth, fifth, and sixth power lines PL3, PL4, PL5, and PL6, the external input device, and the semiconductor chip 110 can be optimized, and as a result, electromagnetic waves from the third, fourth, fifth, and sixth power lines PL3, PL4, PL5, and PL6 are thereby suppressed. This, in turn, prevents the creation of electromagnetic noise in the input power signals, the disconnection of any of the third, fourth, fifth and sixth power lines PL3, PL4, PL5, and PL6, and the occurrence of damage to the semiconductor chip 110.

Although in the particular exemplary embodiment illustrated, all of the power lines of the first, second, and third power interconnections PLP1, PLP2, and PLP3 have serpentine structures, in other possible embodiments, only some of the power lines may incorporate a serpentine structure, depending on the size of the base film 110 and the number of lines of the input interconnection 130.

As discussed above, since the power-transmitting first, second, and third power interconnections PLP1, PLP2, and PLP3 have a serpentine structure, the TCP 100 functions to suppress electromagnetic waves generated from the first, second, and third power interconnections PLP1, PLP2, and PLP3. In particular, since electromagnetic waves are mainly generated from power lines transmitting power signals, the serpentine structures of the lines function to suppress electromagnetic waves in the TCP 100. Accordingly, the exemplary TCP 100 prevents the creation of noise, distortion of signals, damage to the semiconductor chip 120 and disconnection of the input interconnection 130 caused by electromagnetic waves, so that product yields are thereby improved.

As described above, the signal lines of the input signal interconnection SLP transmit the chip control signal received from the external input device to the semiconductor chip 120. Unlike the first, second, and third power connections PLP1, PLP2, and PLP3, however, each of the input signal lines SL does not incorporate a serpentine structure. The reason for this is that, if the input signal line SL were to incorporate a serpentine structure, the control signal might be distorted thereby. Accordingly, the input signal lines SL are preferably made relatively straight, i.e., with few, if any bends therein.

As illustrated in FIG. 1, the input interconnection 130 also includes auxiliary, "dummy" interconnections DLP, which respectively receive dummy power signals and dummy control signals from the external input device and output the dummy power signal and control signals to the external output device electrically connected to the output interconnection 140. The dummy power signals drive respective drivers that are connected to the external output device, and the dummy control signals control the operation of the drivers. Thus, unlike the first, second, and third power interconnections PLP1, PLP2, and PLP3, and the input signal interconnection SLP, the dummy interconnection DLP is not electrically connected to the semiconductor chip 120, but instead, bypasses the chip and thus serves as a pass-through of the dummy power and control signals from the external input device to the drivers on the external output device.

Although in the particular exemplary embodiment illustrated in FIG. 1, a dummy interconnection DLP is shown disposed on both sides of an area corresponding to the first, second, and third power interconnections PLP1, PLP2, and PLP3 and the input signal interconnection SLP, in some possible embodiments, only one dummy interconnection DLP may be present on one or the other side thereof.

The dummy interconnection DLP extends from a first end portion of the base film 110 to a second end portion that faces the first end portion. The dummy interconnection DLP includes a dummy power interconnection DPP, which transmits the dummy power signal, and a dummy signal interconnection DSP that transmits the dummy control signal.

Figure 5:
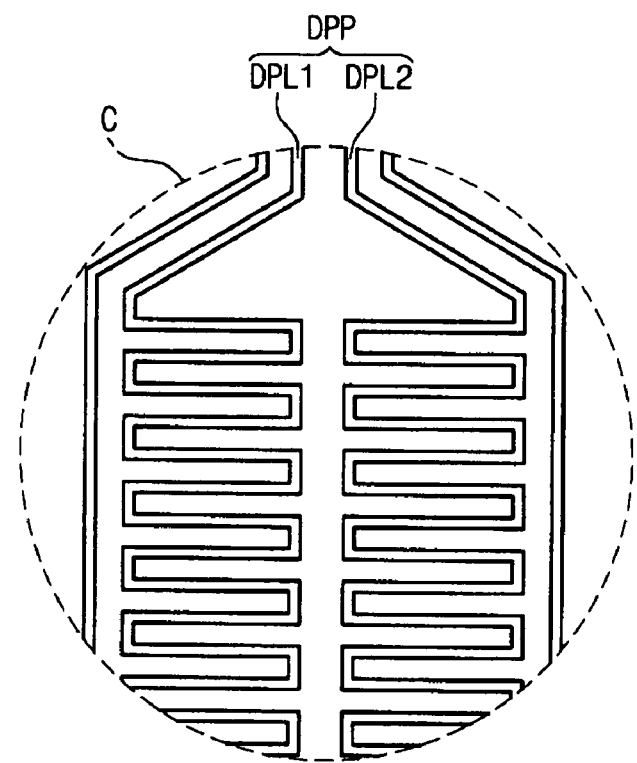
FIG. 5 is an enlarged detail plan view of the region 'C' thereof.

FIG. 5 is an enlarged detail plan view of the region 'C' of the exemplary TCP of FIG. 1. Referring to FIGS. 1 and 5, the dummy power interconnection DPP includes two dummy power lines DPL1 and DPL2 that are spaced apart from each other. A portion of the length of each of the dummy power lines DPL1 and DPL2 is bent in a widthwise direction thereof so as to incorporate a serpentine structure. As above, the dummy power lines DPL1 and DPL2 can include respective bends that extend in the same direction as each other, or as illustrated in FIG. 5C, that extend in opposite directions from each other.

As discussed above, since each of the power-signal-carrying dummy power lines DPL1 and DPL2 incorporates a serpentine structure, the respective lengths of the dummy power lines DPL1 and DPL2 are both longer, and are more easily adjusted, than lines having a relatively straight structure. As discussed above, the serpentine structure enables the impedance match between the dummy power interconnection DPP and the external device to be optimized. Consequently, electromagnetic waves from the dummy power interconnection DPP are suppressed, thereby preventing the occurrence of any noise, signal distortion and disconnection of the dummy interconnection DLP caused by such electromagnetic waves.

Referring to FIG. 2, the output interconnection 140 of the TCP 100 is formed on the bottom surface of the base film 110 to transmit the second signal outputs from the semiconductor chip 120 to the external output device. The output interconnection 140 thus includes a plurality of output lines electrically connected between the semiconductor chip 120 and the external device. A first end portion of each of the output lines is formed with a second input pad OIP that receives a second signal from the semiconductor chip 120, and an opposite, second end portion of each of the output lines is formed with a second output pad OOP, which outputs the second signal. Each second input pad OIP is electrically connected to a respective one or more of the output bumps 122 of the semiconductor chip 120, and each second output pad OIP is electrically connected to an external destination device. An opening 111 is defined by removing a portion of the base film 110 on which the semiconductor chip 120 is mounted. A first output pad IOP of the input interconnection 130 and the second input pad OIP of the output interconnection 140 are exposed through the opening 111, and the bumps of the semiconductor chip 120 are electrically connected to respective ones of the first output pad IOP and the second input pad OIP within the opening 111.

The TCP 100 includes a sealant 150 that fixes the semiconductor chip 120 to the base film 110 and a protection film 160 that protects the input interconnection 130 and the output interconnection 140. The sealant 150 surrounds the semiconductor chip 120 and seals the opening 111, so that the semiconductor chip 120 is fixed to the base film 110. The protection film 160 covers and protects the input and output interconnections 130 and 140. A portion of the protection film 160 corresponding to the opening 111 of the base film 110 is removed so that the first output pad IOP and the second input pad OIP are exposed. In order to electrically connect the external input device to the input interconnection 130 and to connect the external destination device to the output interconnection 140, portions of the protection film 160 corresponding to the first and second end portions of the respective interconnections are also removed.

Figure 6:
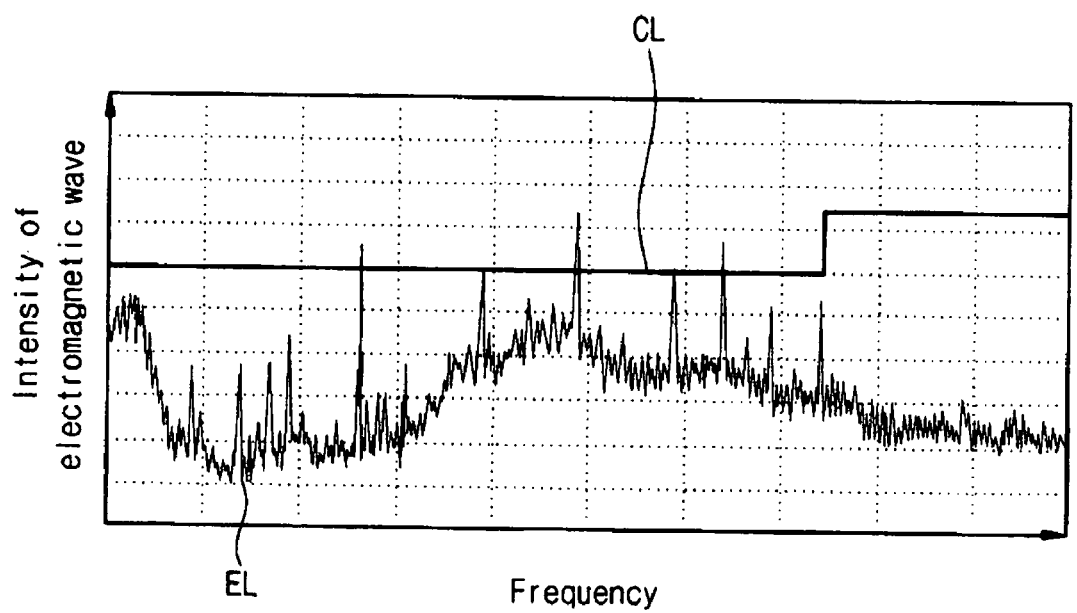
FIG. 6 is a graph of the intensity of an electromagnetic wave as a function of its frequency of the exemplary TCP of FIG. 1; and, FIG. 7 is a plan view of an exemplary embodiment of an LCD in accordance with the present invention.

FIG. 6 is a graph of the intensity of an electromagnetic wave (EL) generated in the exemplary TCP of FIG. 1, plotted as a function of its frequency. As may be seen in FIG. 6, the electromagnetic wave generated from the TCP 100, which is plotted relative to a criterion line (CL) corresponding to a maximum acceptable level of noise level, is situated below that maximum level by at least about 5 dB. That is, since the serpentine structures of the input interconnection 130 function to suppresses electromagnetic waves, electromagnetic waves are rarely generated from the TCP 100, and as a result, the first signal is not distorted due to electromagnetic noise.

Figure 7:
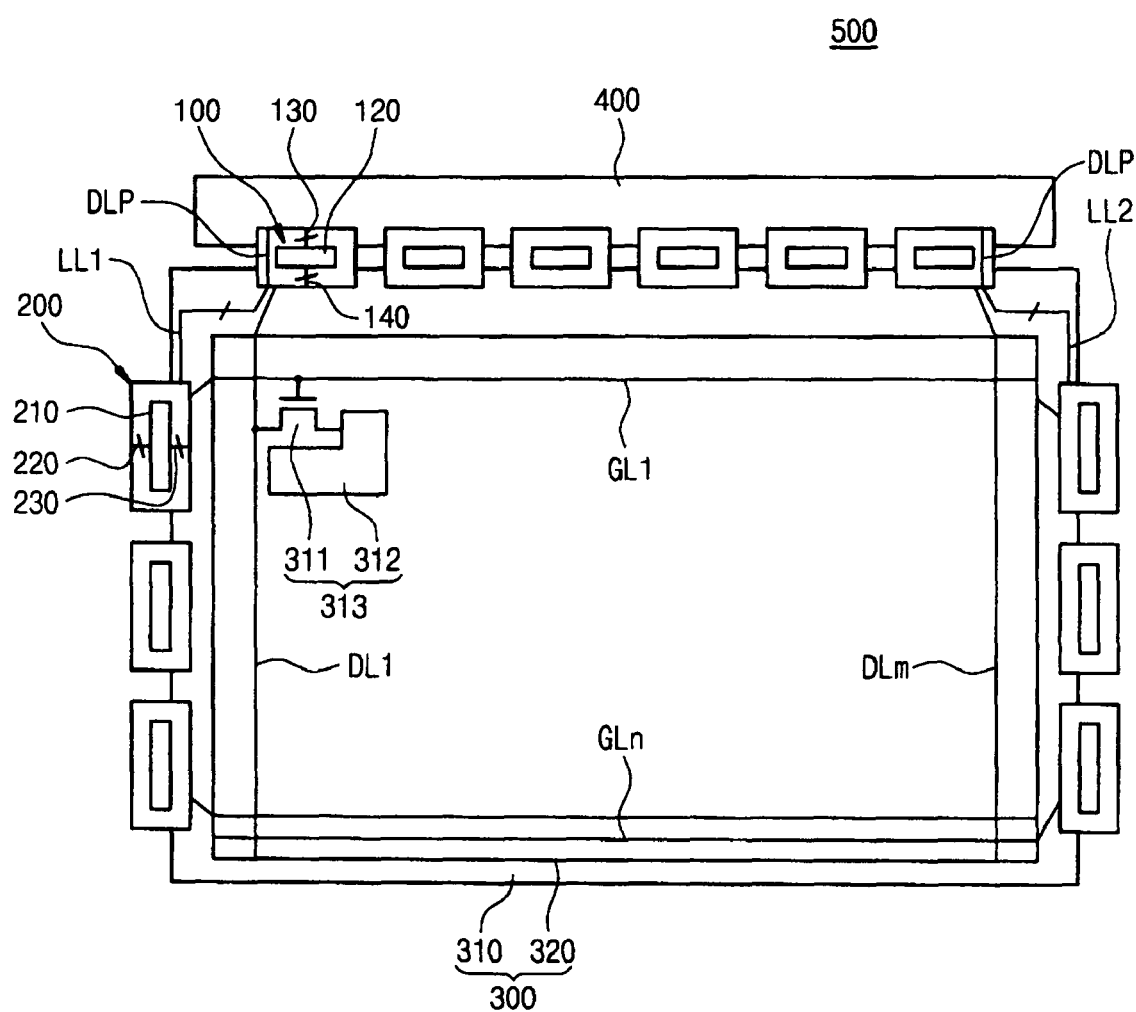

FIG. 7 is a plan view of an exemplary embodiment of an LCD 500 in accordance with the present invention. Referring to FIGS. 1 and 7, the exemplary display apparatus 500 includes a plurality of data TCPs 100, a plurality of gate TCPs 200, a liquid crystal display panel 300, and a printed circuit board 400.

The liquid crystal display panel 300 includes an array substrate 310, an opposed substrate 320 facing the array substrate 320, and a liquid crystal layer (not illustrated) interposed between the array substrate 310 and the opposed substrate 320.

The array substrate 310 includes first to Nth gate lines GL1 to GLn, first to Mth data lines DL1 to DLm, and a plurality of pixels 313.

The first to Nth gate lines GL1 to GLn extend in one direction, and transmit respective gate signals corresponding to an image. The first to Mth data lines DL1 to DLm extend in a second direction orthogonal to the first direction so as to cross the first to Nth gate lines GL1 to GLn, but are insulated therefrom, and transmit respective data signals corresponding to the image.

The pixels 313 are defined by intersections of the first to Nth gate lines GL1 to GLn and the first to Mth data lines DL1 to DLm, and each pixel 313 is a basic element of the image formed by the display panel 300. Each pixel 313 includes a thin film transistor 311, which switches a pixel voltage corresponding to the image, and a pixel electrode 312, which outputs the pixel voltage. The thin film transistor 311 is electrically connected to an associated gate line and an associated data line, and the pixel electrode 312 is electrically connected to a drain electrode of the associated thin film transistor 311.

The data TCPs 100 and the gate TCPs 200 are bonded to respective end portions of the array substrate 310. Since each data TCP 100 has the same elements as those of the TCP illustrated in FIG. 1 and described above, the elements thereof that are the same as those of the embodiment of FIG. 1 are referred to by the same reference numbers, and further detailed description of these elements is omitted for brevity. Also, for convenience of explanation, the semiconductor chips 120 respectively mounted on the data TCPs 100 are referred to as data driving chips.

The input interconnection 130 of each data TCP 100 is electrically connected to the printed circuit board 400, and the output interconnection 140 of each data TCP 100 is electrically connected to a corresponding group of the first to Mth data lines DL1 to DLm of the array substrate 310. The input interconnection 130 receives a data power signal, which drives the data driving chip 120, and a data control signal, which corresponds to the image, from the printed circuit board 400 so as to provide the data power signal and the data control signal to the data driving chip 120. As discussed above, since the power interconnections PLP1, PLP2, and PLP3 that transmit the data power signal have serpentine structures, the length of the input interconnection 130 can be easily adjusted, and is longer than a power interconnection having a conventionally straight structure. Accordingly, since the lengths of the power lines of the input interconnection 130 can be adjusted to achieve impedance matching relative to the printed circuit board 400, the electromagnetic waves can be suppressed and distortion of data control signals caused by noise can be prevented.

The output interconnections 140 of the data TCPs 100 provide a data control signal output from the data driving chips 120 to the first to Mth data lines DL1 to DLm of the panel 300.

The input interconnection 130 further includes a dummy interconnection DLP that transmits a gate power signal that drives the gate TCPs 200, and a gate control signal that controls the gate TCPs 200. The dummy interconnections DLP include a dummy power interconnection DPP, which transmits the gate power signals, and a dummy signal interconnection DSP, which transmits the gate control signals. The dummy power interconnections DPP and the dummy signal interconnections DSP are electrically connected to the array substrate 310.

As illustrated in FIG. 7, the array substrate 310 further includes link interconnections LL1 and LL2 which are electrically connected to respective dummy power and signal interconnections DPP and DSP so as to receive the gate power signal and the gate control signal. Each of the link interconnections LL1 and LL2 is electrically connected to respective ones of the gate TCPs 210 to provide the gate power signal and the gate control signal, which are output from the respective dummy interconnections DLP, to the gate TCPs 200 respectively connected thereto.

Thus, in the exemplary embodiment of FIG. 7, the gate TCPs 200 receive the gate power signal and the gate control signal through the data TCPs 100 and the respective link interconnections LL1 and LL2 of the array substrate 310. In an alternative embodiment, the gate TCPs 200 may be electrically connected to an additional gate printed circuit board (not illustrated), which outputs the gate power and control signals, and receive the gate and power signals exclusively from the gate printed circuit board. In this embodiment, the data TCPs 100 and the array substrate 310 need not include the dummy interconnection DLP and the link interconnections LL1 and LL2.

The gate TCPs 200 output the gate signal and provide the gate signal to the array substrate 310. Although the particular exemplary embodiment of FIG. 7 is illustrated as having three gate TCPs 200 disposed on opposite side end portions of the array substrate 310, with the pixels 313 interposed therebetween, in another possible embodiment (not illustrated), the gate TCPs 200 can also be provided along only one side end portion of the array substrate 310.

Since each gate TCP 200 has the same elements as those of the TCP illustrated in FIG. 1 and described above, the elements thereof that are the same as those of the embodiment of FIG. 1 are referred to by the similar reference numbers, and further detailed description of these elements is omitted for brevity. Also, for convenience of explanation, the semiconductor chips 220 mounted on the gate TCPs 200 are referred to as gate driving chips.

The input interconnection 220 of each gate TCP 200 is electrically connected to respective ones of the link interconnections LL1 and LL2 to provide the gate power and driving signals to the corresponding gate driving chips 210. In accordance with one exemplary embodiment, the power interconnection of each input interconnection 230 of the gate TCP 200, which transmits the gate power signals, incorporates a serpentine structure identical to that of the input interconnection 130 of the data TCPs 200. Accordingly, the length of the power line of the power interconnection of the gate TCP 200 that transmits the gate power signal can be easily adjusted, and is greater than the length of a power line having a relatively straight structure. Therefore, since the length of the power line of the gate TCP 200 can be adjusted so as to optimized the impedance matching relative to an external destination or input device, such as the array substrate 310 or the gate printed circuit board described above, electromagnetic waves in the gate TCPs 200 are suppressed, thereby preventing the distortion of the gate control signals caused by electromagnetic noise.

Each gate driving chip 210 outputs gate signals in response to the gate power signal and the gate driving signal. The output interconnection 230 of the gate TCP 200 receives the gate signal from the gate driving chip 210, and is electrically connected to a corresponding group of the first to Nth gate lines GL1 to GLn of the array substrate 310 so as to controllably output the gate signals to that group of gate lines.

Thus, in the particular exemplary embodiment of FIG. 7, the printed circuit board 400 is electrically connected to the data TCPs 100 to provide both the data and the gate power and control signals to the data TCPs 100, and the data TCPs 100 in turn provide the gate power and control signals to the gate TCPs 200 via the link interconnections LL1 and LL2.

In accordance with the exemplary embodiments described above, the power lines of the data and gate TCPs that transmit power input from an external source are provided with a serpentine structure, which increases the respective lengths of the power lines and enables them to be more easily adjusted than those of relatively straight power lines. Since the lengths of the power lines can be easily adjusted as described above, the TCPs enhance the ability to match the impedance between the power lines and an external input device providing power, and thereby suppress electromagnetic waves in the power lines. Accordingly, the TCPs prevent the creation of noise, distortion of signals, damage to the semiconductor chips thereon, and disconnection of the input interconnections thereof, all of which can be caused by the presence of electromagnetic waves, so that product yields are thereby improved.

As those of skill in this art will by now appreciate, many modifications, substitutions and variations can be made in and to the materials, methods and configurations of the LCD signal transfer members of the present invention without departing from its spirit and scope. Accordingly, the scope of this invention should not be limited to that of the particular embodiments illustrated and described herein, as they are only by way of examples thereof, but instead, should be commensurate with that of the claims appended hereafter and their functional equivalents.

What is claimed is:
1. A signal transfer member, comprising:
a base film;
a semiconductor chip mounted on the base film and operable to receive a first signal and to output a second signal in response thereto;
an input interconnection formed on the base film and electrically connected to the semiconductor chip to receive the first signal from an external source and to provide the first signal to the semiconductor chip; and,
an output interconnection formed on the base film and electrically connected to the semiconductor chip to receive the second signal from the semiconductor chip and to transmit the second signal to an external destination, and wherein the first signal comprises a chip power signal that drives the semiconductor chip and a chip control signal that causes the chip to output the second signal, wherein the input interconnection comprises:

a plurality of input power lines that transmit the chip power signal, at least one of the plurality of input power lines being bent so as to incorporate a serpentine structure; and a plurality of input signal lines that transmit the control signal, and wherein the at least one of the plurality of input power lines is successively bent in a repeating pattern of a first direction, a second direction, and a third direction to have a length that is greater than a length of one of the input signal lines, the first direction is substantially parallel to one side of the base film in a plan view, the second direction is substantially perpendicular to the first direction in a plan view, and the third direction is substantially parallel to the second direction in plan view.

2. The signal transfer member of claim 1, wherein the at least one input power line incorporating the serpentine structure is bent in a widthwise direction of the input power line.

3. The signal transfer member of claim 1, wherein the input interconnection further comprises a plurality of dummy power lines arranged so as to receive power signals from the external source and to transmit the power signals directly to the external destination, such that the power signals bypass the semiconductor chip.

4. The signal transfer member of claim 3, wherein at least one of the dummy power lines is bent so as to incorporate a serpentine structure, the at least one power line incorporating a serpentine structure is bent in a widthwise direction of the dummy power line.

5. The signal transfer member of claim 1, wherein the base film includes an opening corresponding to the semiconductor chip, and wherein selected end portions of the input power and signal lines and the output interconnection are exposed and electrically connected to the semiconductor chip within the opening.

6. The signal transfer member of claim 5, further comprising:

a sealant surrounding the semiconductor chip and sealing the opening so as to fix the semiconductor chip to the base film; and, a protection film positioned over portions of the input and output interconnections so as to cover and protect them.

7. The signal transfer member of claim 1, wherein the output interconnection comprises a plurality of output lines transmitting the second signal to the external destination.

8. A display apparatus, comprising:

a display panel operable to display an image corresponding to an image signal; and, a signal transfer member bonded to an end portion of the display panel so as to output the image signal and provide the image signal to the display panel, the signal transfer member comprising:

a base film;

a semiconductor chip mounted on the base film and operable to receive an input signal corresponding to the image from an external source and to controllably output the image signal to the display panel;

an input interconnection formed on the base film and electrically connected to the semiconductor chip so as to provide the input signal to the semiconductor chip; and, an output interconnection formed on the base film and electrically connected to the semiconductor chip and the display panel so as to transmit the image signal output from the semiconductor chip to the display panel, and wherein the input signal comprises a chip power signal that drives the semiconductor chip and a chip control signal that causes the chip to generate the image signal, wherein the input interconnection comprises:

a plurality of input power lines that transmit the chip power signal, at least one of the plurality of input power lines being bent so as to incorporate a serpentine structure; and a plurality of input signal lines that transmit the control signal, and wherein the at least one of the plurality of input power lines is successively bent in a repeating pattern of a first direction, a second direction, and a third direction to have a length that is greater than a length of one of the input signal lines, the first direction is substantially parallel to one side of the display panel in a plan view, the second direction is substantially perpendicular to the first direction in a plan view, and the third direction is substantially parallel to the second direction in plan view.

9. The display apparatus of claim 8, further comprising a printed circuit board electrically connected to the signal transfer member and outputting the input signal to the signal transfer member, and wherein the display panel comprises a plurality of image signal lines electrically connected to the output interconnection of the signal transfer member.

10. The display apparatus of claim 9, wherein the input interconnection of the signal transfer member further comprises a plurality of dummy power lines that receive power signals from the printed circuit board and provide the power signals directly to the display panel, such that the power signals bypass the semiconductor chip.

11. The display apparatus of claim 10, wherein at least one of the dummy power lines is bent so as to incorporate a serpentine structure, and wherein the display panel further comprises a plurality of connection lines electrically connected to respective ones of the dummy power lines.

12. The display apparatus of claim 8, wherein the signal transfer member comprises a portion of a tape carrier package (TCP).

13. A display apparatus, comprising:

a display panel for displaying an image;

at least one data tape carrier package, comprising: a first base film bonded to the display panel; a first semiconductor chip mounted on the base film and operable to receive a first input signal corresponding to the image from an external source and to output a data signal in response thereto; a first input interconnection formed on the first base film and electrically connected to the first semiconductor chip so as to provide the first input signal thereto; and, a first output interconnection formed on the first base film and electrically connected to the first semiconductor chip and the display panel so as to transmit the data signal output from the first semiconductor chip to the display panel; and, at least one gate tape carrier package, comprising: a second base film bonded to the display panel; a second semiconductor chip mounted on the second base film and operable to receive a second input signal corresponding to the image from an external source and to output a gate signal in response thereto; a second input interconnection formed on the second base film and electrically connected to the second semiconductor chip so as to provide the second input signal thereto; and, a second output interconnection formed on the second base film and electrically connected to the second semiconductor chip and the display panel to provide the gate signal output from the second semiconductor chip to the display panel, wherein the first input signal comprises a first power signal that drives the first semiconductor chip and a data control signal that causes the first chip to generate the data signal, the first input interconnection comprises a plurality of first input power lines for transmitting the first power signal and a plurality of first input signal lines for transmitting the data control signal, at least one of the first input power lines is bent so as to incorporate a serpentine structure, and wherein the at least one of the plurality of first input power lines is successively bent in a repeating pattern of a first direction, a second direction, and a third direction to have a length that is greater than a length of one of the first input signal lines, the first direction is substantially parallel to one side of the display panel in a plan view, the second direction is substantially perpendicular to the first direction in a plan view, and the third direction is substantially parallel to the second direction in plan view.

14. The display apparatus of claim 13, wherein:

the second input signal comprises a second power signal that drives the second semiconductor chip and a gate control signal that causes the second chip to generate the gate signal;

the second input interconnection comprises a plurality of second input power lines transmitting the second power signal and a plurality of second input signal lines transmitting the gate control signal; and, at least one of the second input power lines is bent so as to incorporate a serpentine structure, wherein the at least one of the plurality of second input power lines is successively bent in the first direction and the second direction to have a length that is greater than a length of one of the second input signal lines.

15. The display apparatus of claim 14, wherein the first input interconnection further comprises:

a plurality of dummy signal lines that receive the gate control signal and provide the gate control signal directly to the display panel; and, a plurality of dummy power lines that receive the second power signal and provide the second power signal directly to the display panel, at least one of the dummy power lines being bent so as to incorporate a serpentine structure.

16. The display apparatus of claim 15, wherein the display panel comprises a plurality of connection lines electrically connected to the dummy signal lines and the dummy power lines.

17. The display apparatus of claim 16, further comprising a printed circuit board electrically connected to the data tape carrier package so as to output the first and second input signals to the first input interconnection of the data tape carrier package.

* * * * *